(12) United States Patent
Ishigaki et al.

(10) Patent No.: US 8,673,545 B2
(45) Date of Patent: Mar. 18, 2014

(54) METHOD FOR MANUFACTURING LIQUID CRYSTAL DISPLAY DEVICE

(71) Applicant: Japan Display East Inc., Mobara (JP)

(72) Inventors: Toshimasa Ishigaki, Chiba (JP); Daisuke Sonoda, Chiba (JP); Masanao Yamamoto, Mobara (JP); Osamu Itou, Hitachi (JP); Takato Hiratsuka, Chiba (JP)

(73) Assignee: Japan Display East Inc., Chiba (JP)

( * ) Notice: Subject to any disclaimer, the term of this patent is extended or adjusted under 35 U.S.C. 154(b) by 0 days.

(21) Appl. No.: 13/834,447

(22) Filed: Mar. 15, 2013

(65) Prior Publication Data

US 2013/0280661 A1    Oct. 24, 2013

(30) Foreign Application Priority Data

Apr. 18, 2012  (JP) ................................ 2012-094463

(51) Int. Cl.
   *G03F 7/20*      (2006.01)
   *G02F 1/1333*    (2006.01)

(52) U.S. Cl.
   USPC ........................... 430/319; 430/321; 430/330

(58) Field of Classification Search
   None
   See application file for complete search history.

(56) References Cited

U.S. PATENT DOCUMENTS

| 6,630,785 B1 * | 10/2003 | Lu ................................. 313/505 |
| 2010/0173246 A1 | 7/2010 | Takita |
| 2011/0177302 A1 | 7/2011 | Takita |
| 2011/0229661 A1 | 9/2011 | Takita |
| 2012/0082941 A1 * | 4/2012 | Ishigaki et al. ............... 430/320 |

FOREIGN PATENT DOCUMENTS

| JP | 6-214244 | 8/1994 |
| JP | 2009-98616 | 5/2009 |
| JP | 2009-98673 | 5/2009 |
| JP | 2009-258722 | 11/2009 |
| JP | 2009-258723 | 11/2009 |

* cited by examiner

*Primary Examiner* — John A. McPherson
(74) *Attorney, Agent, or Firm* — Antonelli, Terry, Stout & Kraus, LLP.

(57) ABSTRACT

In a method of manufacturing a liquid crystal display device in which a plurality of pixels are arranged in a matrix, each of the pixels has an insulator wall structure at a boundary of the pixels, and a wall electrode is provided at least at a side of the wall structure, the wall structure being formed by: using a chemically amplified resist as a material of the wall structure, a step of applying the chemically amplified resist; a step of exposing and developing the chemically amplified resist; a step of irradiating light on an entire surface to perform post exposure; a step of pre-calcinating the chemically amplified resist at a temperature lower than a main calcination temperature; and a step of performing main calcination at a temperature higher than a pre-calcination temperature.

13 Claims, 5 Drawing Sheets

METHOD FOR MANUFACTURING LIQUID CRYSTAL DISPLAY DEVICE

CLAIM OF PRIORITY

The present application claims priority from Japanese patent application JP2012-094463 filed on Apr. 18, 2012, the content of which is hereby incorporated by reference into this application.

BACKGROUND OF THE INVENTION

1. Field of the Invention

The present invention relates to a method for manufacturing a wall electrode type liquid crystal display device, and particularly, to a method for manufacturing a liquid crystal display device in which formation of a wall and formation of an insulating and planarizing film are improved.

2. Description of the Related Art

The liquid crystal display device has characteristics such as a high display quality, a thin thickness, a light weight, and low power consumption so that the liquid crystal display device is widely used from a small portable terminal to a large size television.

In the meantime, a viewing angle property is a concerned problem in the liquid crystal display device. Therefore, in order to achieve a wider viewing angle, an IPS (in-plane switching) mode liquid crystal display device is suggested. In the IPS mode, in a state where liquid crystal molecules are horizontally laid, an electric field which is parallel to a substrate is applied to the liquid crystal molecules to rotate the liquid crystal molecules in a horizontal plane so that a light quantity of a backlight is controlled to display an image.

Japanese Patent Application Laid-Open Publication (JP-A) No. Hei6(1994)-214244 discloses a liquid crystal display device which includes m×n pixels arranged in a matrix, an active element in each of the pixels, a driving unit which applies a predetermined voltage waveform, and an electrode pair which maintains a gap between upper and lower substrates in the pixel to be constant and has a predetermined structure in which an electric field, which is parallel to surfaces of the substrates, is applied between the electrode pair to control an orientation state of the liquid crystal molecules to modulate light (see Abstract).

Further, in order to implement a liquid crystal display device which includes an electrode pair between upper and lower substrates and applies an electric field, which is parallel to surfaces of the substrates, to the electrode pair to control an oriented state of the liquid crystal molecules, prior to the present invention, a liquid crystal display device is suggested in which a plurality of pixels are arranged in a matrix, each pixel includes large walls which extend in a longitudinal direction of each of the pixels at both ends of the pixel and a small wall which extends between the large walls to be parallel to the large walls and has a lower height than the large walls, a TFT side electrode is formed on the small wall, and a wall electrode is formed at a side of the larger wall (JP Application number: 2012-66655).

SUMMARY OF THE INVENTION

In a wall electrode type liquid crystal display (LCD), the wall electrode is configured such that a wall having a height of approximately 6 μm is formed of an organic material and an ITO is disposed at a side thereof to form an electrode. For example, if a wall having a size of a bottom of 6 μm and a height of 6 μm (an aspect ratio is 1.0) is formed, an angle of one side of the wall (a tapered angle) needs to be 70 degrees or larger (a width of a top of the wall is 1.6 μm at a tapered angle of 70 degrees). In the case of an organic passivation (PAS) resist which is used for a general TFT (thin film transistor), the tapered angle does not reach at 60 degrees so that this material cannot form a satisfactory wall (a wall becomes a triangle wall at a tapered angle of 63 degrees and a film thickness is reduced at 63 degrees or smaller. Further, the organic PAS resist in the related art is a positive resist which uses naphthoquinone diazide (hereinafter, abbreviated as NQD) as a photosensitizing agent, and thus a film is strongly colored and the fading of exposure light is bad. Therefore, as the thickness of a coating film is increased, the exposure amount is sharply increased (sensitivity is lowered). For example, in the case of the positive resist for pattern processing using the NQD, a standard thickness of the coating film is small, for example, approximately 1.5 μm, and thus the exposure amount is satisfactorily 30 mJ/cm$^2$. However, if the thickness of the coating film for an organic PAS is approximately 2.5 μm, the exposure amount is increased to be 100 mJ/cm$^2$ or more. Further, if the thickness of the coating film for a wall is 6 μm or larger, the exposure amount of 500 mJ/cm$^2$ is insufficient.

Further, in a thin film application area, a relatively transparent negative resist may easily obtain a higher sensitivity than the NQD positive resist. However, after forming the wall, there is a process of forming an insulating and planarizing film between the walls and the negative resist cannot be used in this process. The reason is because in the case of the negative resist, a resin which is in contact with light is hardened (molecular weight is increased) to be insoluble in a developing solution so that a reflow by heating is small and the negative resist is not leveled. Therefore, when the negative resist is used to form the wall, it is required to newly adapt a positive resist material as the insulating and planarizing film between the walls. In the case of the positive resist in which the NQD, which is in contact with the light, is changed to show a development solubility, the resin itself is not changed (the molecular weight is not changed) so that the positive resist reflows by heating the positive resist after forming the pattern to be leveled. However, when the organic PAS resist of the related art is used as the positive resist, the reflow and a hardening reaction of the resin simultaneously occur during the heating, so that the planarization is insufficient. Further, the organic PAS material of the related art has a structure in that a large quantity of carboxylic acid group and a functional group (for example, epoxy group) which reacts with the carboxylic acid among the resins and the carboxylic acid group and the functional group are thermally reacted so that the molecular weight is increased, which results in the durability as a permanence film. When applying heat, the reaction between the carboxyl acid and the reactive functional group (for example, epoxy group) rapidly proceeds together with the reflow so that the planarization is insufficient.

The present invention has been made in an effort to provide a manufacturing method that forms a wall having a large tapered angle at a side of a wall and a large aspect ratio and satisfactorily forms an insulating and planarizing film between walls, in a wall electrode type liquid crystal display device.

In the wall electrode type liquid crystal display device, a material for forming the wall and the forming process are reviewed to find out that if a chemically amplified positive resist is used, it is possible to cope with both formation of a wall having a high aspect ratio and formation of an insulating and planarizing film between the walls using the same material. In the present invention, a post exposure process→a pre-calcination process→a main calcination process are performed using the chemically amplified resist after a development process so that a wall having a tapered angle of 70 degrees or larger may be formed. Therefore, the main calcination is performed using a positive resist without performing the post exposure and the pre-calcination so that a sufficient insulating and planarizing film may be formed. Here, the chemically amplified resist generates a chemical active species by the exposure and obtains a pattern when a base material resin of the resist reacts using the chemical active species as a catalyst. For example, as the active species, an acid is widely used.

According to an aspect of a method for manufacturing a liquid crystal display device of the present invention, in the method of manufacturing a liquid crystal display device in which a plurality of pixels are arranged in a matrix, each of the pixels has an insulator wall structure at a boundary of the pixels, and a wall electrode is provided at least at a side of the wall structure, the wall structure may be formed by: using a chemically amplified resist as a material of the wall structure; applying the chemically amplified resist; and exposing and developing the chemically amplified resist.

Further, in the method of manufacturing a liquid crystal display device of the present invention, a positive resist may be used as the chemically amplified resist.

The method of manufacturing a liquid crystal display device of the present invention may further include: after the exposing and developing of the chemically amplified resist, performing post-exposure by irradiating light on the entire remaining chemically amplified resist; performing pre-calcination at a temperature lower than a main calcination temperature; and performing a main calcination at a temperature higher than a pre-calcination temperature.

Further, in the method of manufacturing a liquid crystal display device of the present invention, the pre-calcination temperature may be 150° C. or lower and the main calcination temperature may be 200° C. or higher.

Further, in the method of manufacturing a liquid crystal display device of the present invention, the pre-calcination temperature may be 80 to 120° C., which is equal to or lower than a glass transition temperature of the resist material, and the main calcination temperature may be 200 to 250° C. at which a hardening reaction proceeds.

Further, in the method of manufacturing a liquid crystal display device of the present invention, a tapered angle of the formed wall structure may be equal to or larger than 70 degrees and smaller than 90 degrees.

In the method of manufacturing a liquid crystal display device of the present invention, the insulating and planarizing film may be further formed by: using a positive resist as a material of the insulating and planarizing film provided between the wall structures, applying the positive resist; exposing and developing the positive resist, and performing main calcination on the positive resist.

Further, in the method of manufacturing a liquid crystal display device of the present invention, a chemically amplified positive resist may be used as the positive resist.

Further, in the method of manufacturing a liquid crystal display device of the present invention, as the performing of the main calcination, the main calcination may be performed at 200° C. or higher.

Further, in the method of manufacturing a liquid crystal display device of the present invention, when the resist is exposed, the resist may be exposed by a mask having an opening which is equal to or larger than a horizontal width of an apex of the wall.

Further, in the method of manufacturing a liquid crystal display device of the present invention, the main calcination may be performed at a rate of temperature increase of 5° C. or higher.

Further, in the method of manufacturing a liquid crystal display device of the present invention, the main calcination may be performed at a rate of temperature increase of 10° C. or higher.

In the method of manufacturing a liquid crystal display device of the present invention, the same material may be used for both the resist material of the wall structure and the resist material of the insulating and planarizing film.

According to an aspect of the present invention, in the wall electrode type liquid crystal display device, a wall with a large tapered angle at a side of the wall and a large aspect ratio may be formed. Further, the insulating and planarizing film between walls may be flatly formed.

Further, a material for the wall and a material for the insulating and planarizing film may be the same, and thus low cost may be achieved.

DETAILED DESCRIPTION OF THE INVENTION

Hereinafter, embodiments of the present invention will be described with reference to the drawings.

Figure 5:
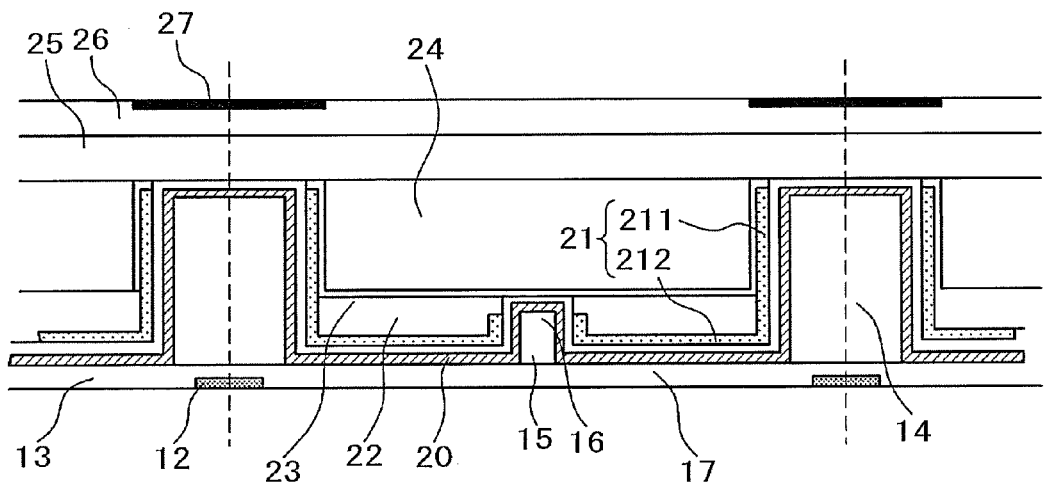
FIG. 5 is a cross-sectional view of an example of a wall electrode type liquid crystal display device to which the present invention is applied.

First, an example of a wall electrode type liquid crystal display device to which the present invention is applied will be described with reference to FIG. 5 which illustrates a cross-sectional structure of one pixel and FIG. 6 which illustrates a plane structure of one pixel. FIG. 5 illustrates, for example, a cross-sectional structure taken along the plane A-A' of FIG. 6. On a substrate, a signal line 12 and an insulating film 13 are formed, an insulator wall structure 14 is provided at a pixel boundary thereon, and a wall structure 15 which is smaller than the wall structure is provided between the wall structures at the pixel boundary. The wall structure is formed of, for example, an organic film. In the wall structures 14 which are disposed at both ends of the pixel, a wall shaped electrode 211 which covers a side of the wall structure with an electrode and a flat electrode 212 which extends from a surface of the wall shaped electrode, which is in contact with the substrate, in a planar direction are formed. The wall shaped electrode 211 and the flat electrode 212 are electrically connected so that the wall shaped electrode and the flat electrode are combined to be called as a wall electrode 21. An insulating and planarizing film 22 and an alignment film 23 are disposed between the flat electrode 212 and a liquid crystal layer 24. An electrode at TFT side (hereinafter, referred to as "TFT side electrode 16") is formed in the small wall structure 15 so as to cover the small wall structure and a storage capacitor electrode 17 is formed from a surface, which is in contact with a substrate of the small wall structure, in the planar direction. An interlayer insulating film 20 is provided between the storage capacitor electrode 17 and the flat electrode 212 and the flat electrode 212 is formed with an interlayer insulating film 20 interposed therebetween above the storage capacitor electrode 17 so that an overlapping area serves as a storage capacitor.

On the substrate, the wall structure 14, the small wall structure 15, the TFT side electrode 16, the storage capacitor electrode 17, the interlayer insulating film 20, the wall electrode 21, the insulating and planarizing film 22, and the alignment film 23 are formed to configure a TFT side substrate.

In the meantime, on the substrate, a black matrix (BM) 27, a color filter (CF) 26, and an over coat (OC) 25 are formed to configure a CF side substrate.

Further, the TFT side substrate and the CF side substrate are bonded and the liquid crystal layer 24 is encapsulated between both the substrates.

Figure 6:
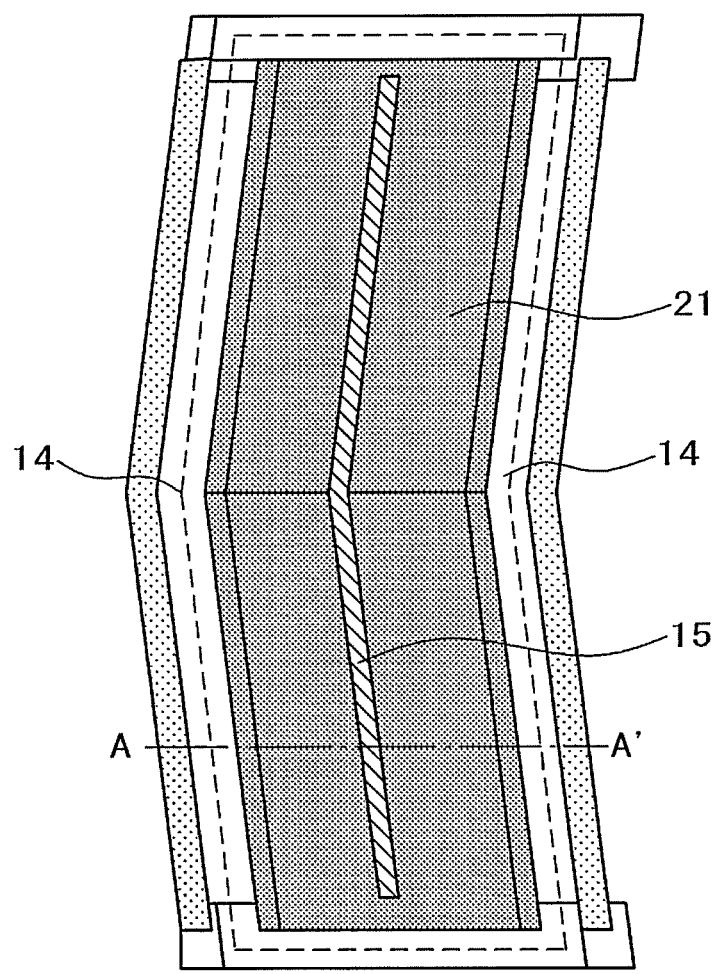
FIG. 6 is a plan view of an example of a wall electrode type liquid crystal display device to which the present invention is applied.

In addition, the wall electrode type liquid crystal display device illustrated in FIGS. 5 and 6 is an example of a liquid crystal display device to which the present invention is applied and the present invention may also be applied to, for example, a liquid crystal display device which does not include the flat electrode 212 or the storage capacitor electrode 17.

In such a liquid crystal display device, as a material for forming the wall structure, a chemically amplified resist, for example, a chemically amplified positive resist is used. After applying the chemically amplified resist and performing the exposure and development processes, a post exposure process→a pre-calcination process→a main calcination process are performed to form the wall structure.

Further, the insulating and planarizing film is formed by performing the main calcination without performing the post exposure process and the pre-calcination process after applying the positive resist, for example, the chemically amplified positive resist and performing the exposure and development processes.

As the chemically amplified positive resist, for example, a known material, which is disclosed in JP-A-2009-98616, JP-A-2009-98673, JP-A-2009-258722, and JP-A-2009-258723, may be used.

Figure 1:
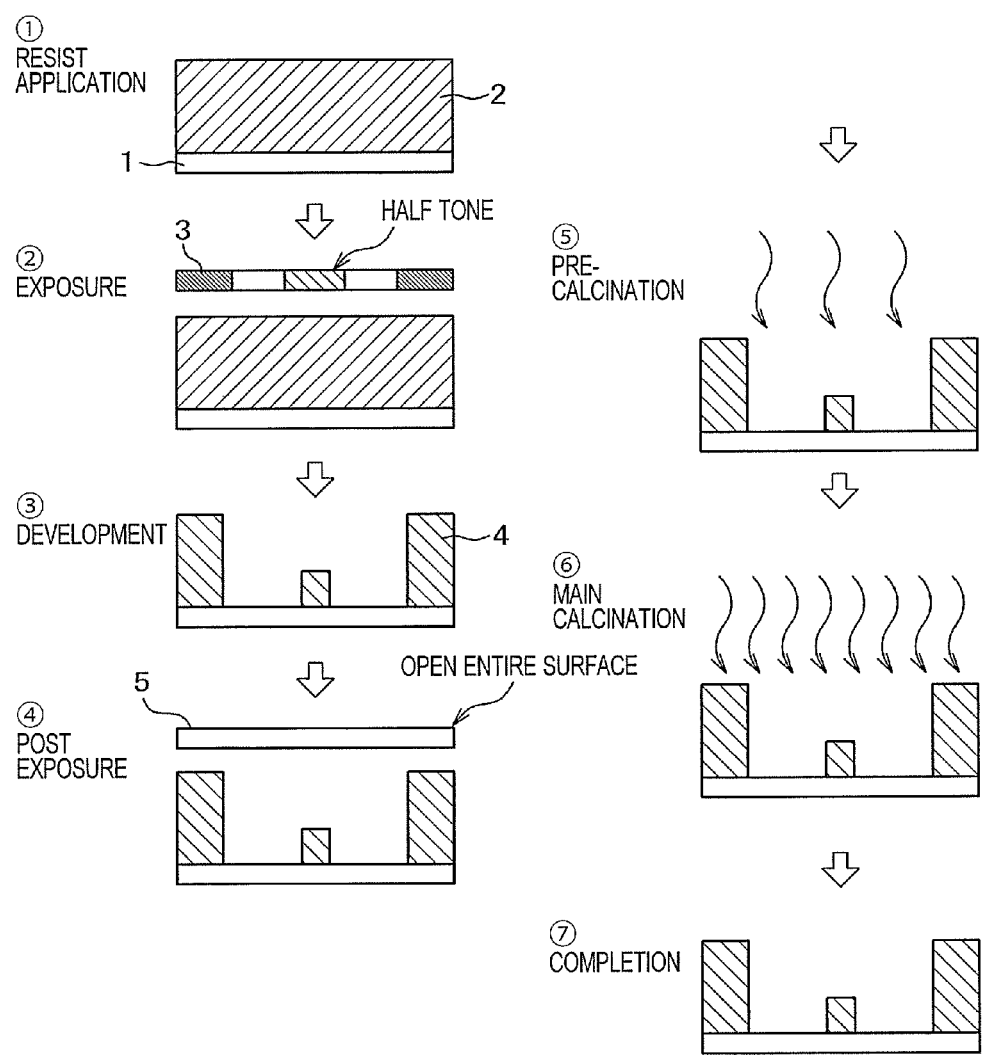
FIG. 1 is a view illustrating a wall forming process of a liquid crystal display device according to an embodiment of the present invention.

FIG. 1 illustrates an example of a wall structure forming process.

(1) In the resist application process, a chemically amplified resist 2 is applied on a substrate 1 to have a uniform thickness and then dried.

(2) In the exposure process, the chemically amplified resist 2 is exposed using a photo mask 3 having a pattern of the wall. In the drawing, a half tone portion of the photo mask 3 corresponds to the small wall structure.

(3) In the development process, a resist 2 in an exposed portion is removed and a portion of the wall structure 4 remains.

(4) In the post exposure process, light is irradiated onto a developed chemically amplified resist 2 through a fully transmissive mask 5.

(5) In the pre-calcination process, calcination of the remaining chemically amplified resist 2 is performed at a temperature which is lower than in the main calcination process, for example, 150° C. or lower, and preferably, at 80 to 120° C. which is below a glass transition temperature of the resist material.

(6) In the main calcination process, calcination of the remaining chemically amplified positive resist 2 is performed at a temperature which is higher than in the pre-calcination process, for example, 200° C. or higher, and preferably, at 200 to 250° C. at which the material is hardened.

Figure 2:
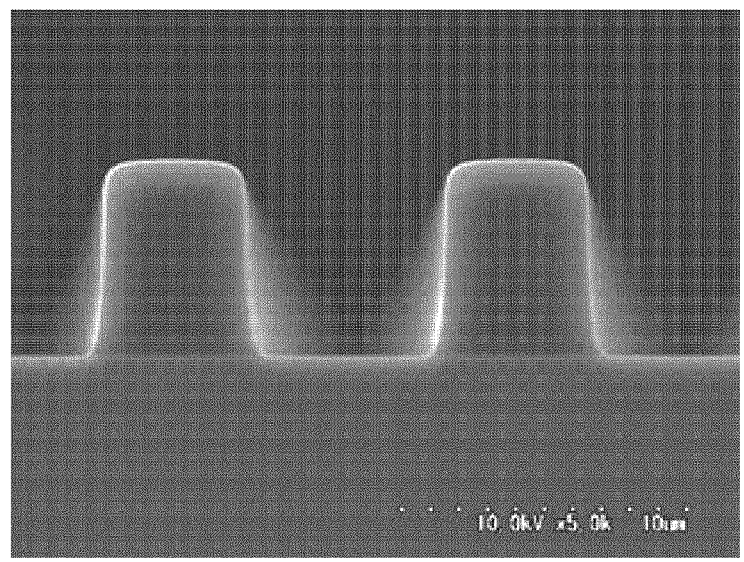
FIG. 2 is a view illustrating a cross-section of the wall structure formed by a process of the embodiment of the present invention.

(7) As illustrated in a final state, a large wall structure and a small wall structure may be obtained. FIG. 2 illustrates an example of a cross-section of the wall structure observed by an SEM. As illustrated in FIG. 2, a wall in which a tapered angle at a side of the wall is large and an aspect ratio is large may be formed.

When the chemically amplified positive resist is touched by light, a photo acid generating agent is dissolved to generate an acid, a protective group of a resin is separated due to a catalyst reaction of the acid, and a portion from which the protective group is separated is changed into carboxyl acid to show a development solubility. If the post exposure (irradiates UV on entire surface) is performed (because of a positive type, light does not reach at a portion which remains after development) after development, the protective group is separated to generate large quantity of carboxyl acid. Further, similarly to the NQD type organic PAS resist in the related art, a hardening reaction of the carboxyl acid and the reactive functional group (for example, epoxy group) contained in the resin occurs so that it is difficult to thermally reflow the material. Further, in a state where the pre-calcination is performed at a temperature (approximately 100° C.) lower than a glass transition temperature of the material (approximately 100° C.) and the material is never reflown, the reaction of the carboxyl acid and the reactive functional group (for example, epoxy group) proceeds so that the thermal reflow at the time of the main calcination may be lower. The effect of the pre-calcination is achieved even in the NQD type of the related art. However, in the case of the chemically amplified type, an amount of a photosensitive agent having a large optical absorption is one tenth of NQD type or lower. Therefore, the coating film is transparent and fading of the light is good. Further, the reaction proceeds by diffusing the acid generated by the light into the film so that the tapered angle at the time of completion of the development is more sharply finished than the NQD type of the related art. Therefore, a large tapered angle of 70 degrees or larger, which may not be endured by the NQD type organic PAS resist of the related art even though the post exposure and the pre-calcination are performed, may be obtained in the chemically amplified positive type resist.

Figure 3:
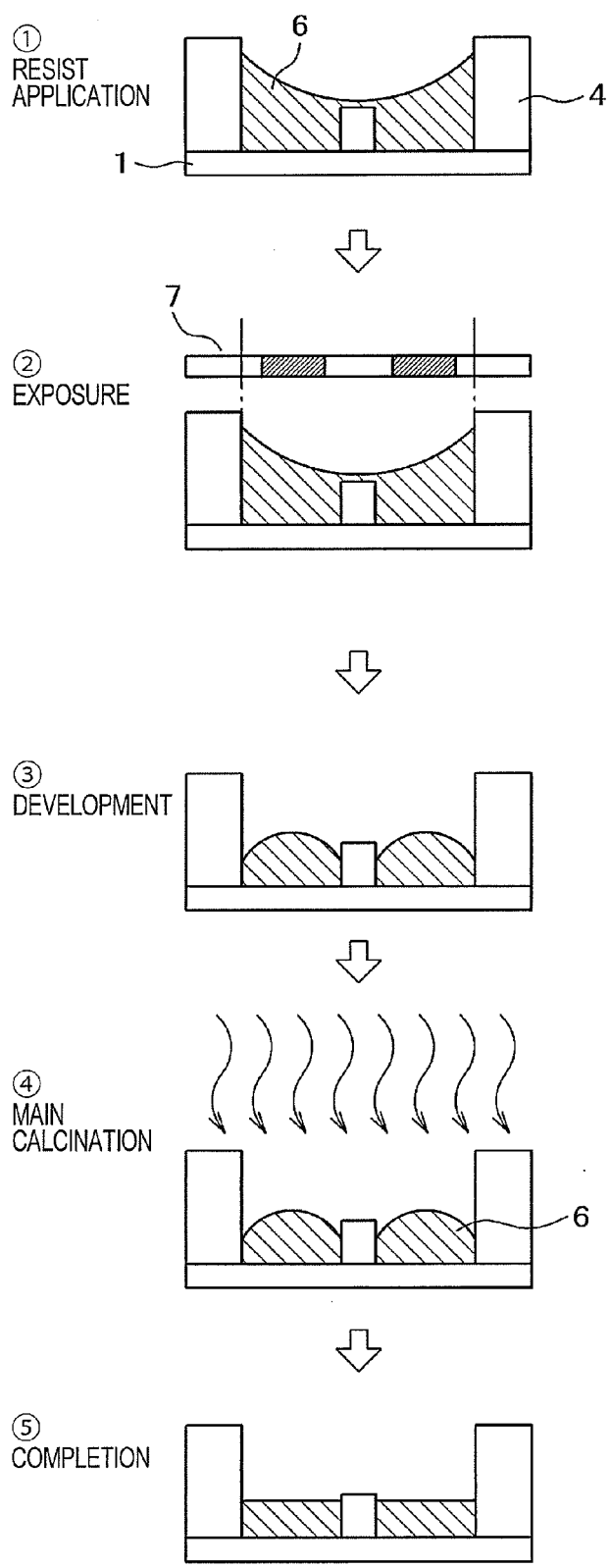
FIG. 3 is a view illustrating an insulating and planarizing film forming process of the liquid crystal display device according to the embodiment of the present invention.

FIG. 3 illustrates an example of an insulating and planarizing film forming process.

(1) In the resist application process, a positive resist 6, for example, a chemically amplified positive resist is applied and dried in a concave portion between the wall structures 4. As illustrated in the drawing, the resist 6 is formed to be thick near the wall and thin at the center thereof.

(2) In the exposure process, the positive resist 6 is exposed through a photo mask 7 which opens the wall portion and the vicinity of the wall. As the photo mask 7, a mask having an opening, which is equal to or larger than a horizontal width of the apex of the wall, is used.

(3) In the development process, a resist 6 of the exposed portion is removed. As illustrated in the drawing, a convex shaped resist remains between the wall structures.

(4) In the main calcination process, the main calcination is performed at a high temperature, for example, 200° C. or higher. By doing this, the reflow of the positive resist 6 is performed.

In the meantime, the main calcination is performed, for example, at a rising temperature of 5° C. or higher, and more preferably, at a rising temperature of or higher.

(5) As illustrated in the finished state, the positive resist 6 is reflown during the main calcination process to obtain a flat insulating and planarizing film.

If the main calcination is performed on a development completed film of the chemically amplified positive resist while omitting the post exposure and the pre-calcination, the thermal process is performed on the chemically amplified positive resist with the protective group of the resin. If a heat is applied to the NQD type organic PAS of the related art, the carboxyl acid and the reactive functional group (for example, epoxy group) instantly reacts. However, in the case of the chemically amplified positive resist, the protective group is separated due to the heat to generate the carboxyl acid, and then the reaction with the reactive functional group (for example, epoxy group) occurs. Therefore, the thermal reflow proceeds as much as the hardening reaction is significantly delayed so that a sufficient planarizing film is obtained.

EMBODIMENTS

An embodiment of the wall electrode structure formation illustrated in FIG. 5 will be described hereinafter.

(1) Formation of Wall

A chemically amplified positive resist (a solid content 45%) having an acrylic resin having a molecular weight of approximately 20000 as a base material was applied by a spin coater at a rotational frequency of 2000 rpm and then dried on a hot plate set at 90° C. for five minutes. In this case, the film thickness was 7.7 μm (FIG. 1(1) Resist application).

Next, an amount of 100 mJ/cm$^2$ was exposed using an exposing unit having a ghi line light source through a photo mask (FIG. 1(2) Exposure). After performing a PEE (post exposure bake: baking after exposure) using a hot plate at 60° C. for two minutes, puddle development was performed using 0.4% TMH (tetramethylammonium hydroxide) for 90 seconds, and then cleaning was performed with pure water for 60 seconds (FIG. 1(3) Development).

Next, post exposure is performed. A fully transmissive mask (a rough plate) was inserted in an exposure unit having a ghi line light source and light of 300 mJ/cm$^2$ was irradiated (FIG. 1(4) Post exposure). Thereafter, in an oven at a rate of temperature increase of approximately 10° C., the pre-calcination (maintain 100° C. for 30 minutes) (FIG. 1(5) Pre-calcination) and the main calcination (maintain 230° C. for 30 minutes) (FIG. 1(6) Main calcination) were performed to obtain a wall having a film thickness of 6 μm, a width of 5 μm, and a tapered angle of 87 degrees as illustrated in FIG. 2 (FIG. 1(7) Completion).

Further, the small wall, which was disposed between the large walls, was collectively formed with the large wall while a half tone area having a transmissivity of 20% is provided in a position of the small wall of a wall pattern forming mask. In this case, a film thickness of the small wall was 3 μm.

(2) Formation of TFT Side Electrode, Storage Capacitor Electrode, Interlayer Insulating Film, and Wall Electrode.

The TFT side electrode 16 and the storage capacitor electrode 17 were formed such that amorphous ITO was sputtered, an electrode pattern of a positive resist was formed by application, exposure, and development, an ITO in a portion which was not covered with the resist was wet-off etched with oxalic acid to be removed, and after peeling the resist, the ITO was heated at 230° C. to be a poly compound.

Similarly, the interlayer insulating film 20 (SiN•CVD photolithography dry etching), and the wall electrode 21 (ITO sputter photolithography wet etching—ITO calcination) were formed.

(3) Formation of Insulating and Planarizing Film (PAS)

Similarly to the formation of the wall, the chemically amplified positive resist (approximately 45% of solid content) was applied by the spin coater at a rotational frequency of 3000 rpm and then dried on the hot plate set at 90° C. for two minutes. The cross-section at this time was the same as a shape illustrated in FIG. 3 ((1) Application).

Next, an amount of 100 mJ/cm$^2$ was exposed using an exposing unit having a ghi line light source through the photo mask. In this case, the mask used a pattern whose one side was 2 μm larger than a size of the wall. After performing PEE on the hot plate at 60° C. for two minutes, the puddle development was performed with 0.4% TMAH for 90 seconds and then cleaning was performed with pure water for 60 seconds. The cross-section at this time was the same as a shape illustrated in FIG. 3 ((2) Exposure and (3) Development).

Next, without performing the post exposure (exposure for entire surface) and the pre-calcination (100° C.) which were used to form the wall, the main calcination (maintains 230° C. for 30 minutes) was performed (FIG. 3 (4) Main calcination). By omitting the exposure for the entire surface and the pre-calcination, the reflow proceeded as much as the hardening reaction of the resin was delayed to obtain a flat shape illustrated in FIG. 3 ((5) Completion).

Comparative Embodiment (3) Formation of Insulating and Planarizing Film (PAS)

An NQD type organic PAS resist 8 (a solid content 32%) having an acrylic resin having a molecular weight of approximately 7000 of the related art as a base material was applied by a spin coater at a rotational frequency of 1000 rpm and then dried on the hot plate set at 90° C. for two minutes. The cross-section at this time was the same as a shape illustrated in FIG. 4 ((1) Application).

Next, an amount of 200 mJ/cm$^2$ was exposed using an exposing unit having a ghi line light source through the photo mask 7. In this case, the mask used a pattern whose one side was 2 μm larger than a size of the wall. Thereafter, the puddle development was performed with 0.4% TMH for 60 seconds and then cleaning was performed with pure water for 60 seconds. The cross-section at this time was the same as a shape illustrated in FIG. 4 ((2) Exposure).

Figure 4:
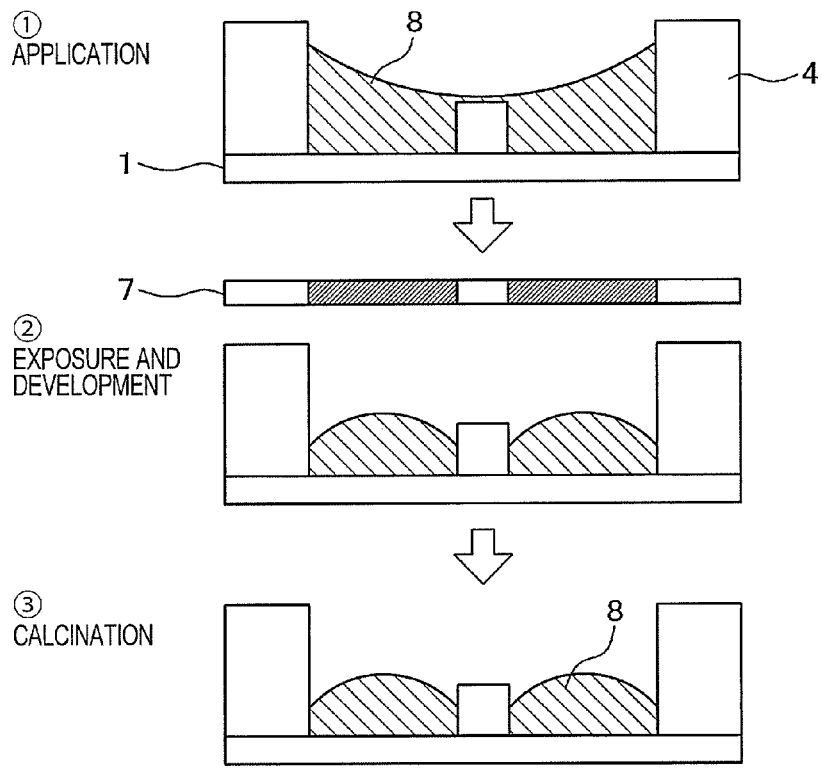
FIG. 4 is a view illustrating an insulating and planarizing film forming process of a liquid crystal display device according to a comparative embodiment.

Next, after performing the post exposure (entire surface at 300 mJ/cm$^2$), the main calcination (maintains 230° C. for 30 minutes) was performed. In the NQD type material of the related art, if the post exposure is omitted, strong coloring of the NQD remains so that the NQD needs to be transparent by the post exposure when the NQD is used for the pixel portion. Similarly to the embodiment, even though the pre-calcination was omitted, the hardening reaction of the resin was rapid, and thus the reflow was insufficient so that a film with a step as illustrated in FIG. 4 ((3) Calcination) is formed.

Hereinafter, advantageous effects according to the embodiment will be described.

(1) By performing the post exposure, the pre-calcination, and the main calcination processes using the chemically amplified positive resist, a wall having a film thickness of 4 μm or larger and a tapered angle of 70 degrees or larger may be formed.

In the case of the organic PAS resist which is used in a general TFT, the tapered angle is 60 degrees or smaller with a film thickness of 2 µm. Therefore, a satisfactory wall may not be formed with this material. Further, the organic PAS resist in the related art is a positive resist which uses naphthoquinone diazide (hereinafter, abbreviated as NQD) as a photosensitizing agent, and thus a film is strongly colored and the fading of exposure light is bad. Therefore, as the thickness of a coating film is increased, the exposure amount is sharply increased (sensitivity is lowered). In the case of the chemically amplified type, an amount of photosensitive agent having a large optical absorption is one tenth of NQD type or lower. Therefore, the coating film is transparent and fading of the light is good. Further, the acid generated by the light is diffused into the film so that the tapered angle at the time of completion of the development is more sharply finished than the NQD type of the related art. If the post exposure (irradiates UV on entire surface) is performed (light does not react on a portion which remains after development) after development, the protective group is separated to generate large quantity of carboxyl acid. In addition, similarly to the NQD type organic PAS resist in the related art, a hardening reaction of the carboxyl acid and the reactive functional group (for example, epoxy group) contained in the resin exceeds the thermal reflow so that the taper after development is easily maintained. Further, the pre-calcination is performed at a temperature lower than a glass transition temperature of the material so that the reaction of the carboxyl acid and the reactive functional group (for example, epoxy group) may proceed in a state where the material is never reflown, and thus the thermal reflow at the time of main calcination may be lower.

(2) By a process that proceeds to the main calcination using the chemically amplified positive resist while omitting the post exposure and the pre-calcination, a satisfactory insulating and planarizing film between the walls may be formed.

If the main calcination was performed on a development completed film of the chemically amplified positive resist while omitting the post exposure and the pre-calcination, the thermal process was performed with the protective group of the resin. If a heat is applied to the NQD type organic PAS of the related art, the carboxyl acid and the reactive functional group (for example, epoxy group) instantly reacts. However, in the case of the chemically amplified positive type, the protective group is separated due to the heat to generate the carboxyl acid, and then the reaction with the reactive functional group (for example, epoxy group) occurs. Therefore, the thermal reflow proceeds as much as the hardening reaction is significantly delayed so that a sufficient planarizing film is obtained.

(3) By changing the process using the chemically amplified positive resist, the wall and the insulating and planarizing film between the walls may be formed of the same material.

In the case of the NQD positive resist, the coloring of the coating film was strong and sensitivity is significantly lowered as the coating film became thicker so that a relatively transparent negative resist is advantageous in order to obtain high sensitivity with a thick film. However, the negative resist may not be used for a process of planarizing between the walls using an insulating film. The reason is because in the case of the negative resist, a resin, which is in contact with light, is hardened (molecular weight is increased) to be insoluble in a developing solution so that the thermal reflow is small and a sufficient planarizing film is not obtained. Even though a separate positive resist material may be used on the insulating and planarizing film between the walls, if the organic PAS resist of the related is used, a rapid hardening reaction together with the reflow occurs during the heating so that the planarizing performance is insufficient.

What is claimed is:

1. A method for manufacturing a liquid crystal display device in which a plurality of pixels are arranged in a matrix, each of the pixels has an insulator wall structure at a boundary of the pixels, and a wall electrode is provided at least at a side of the wall structure, the wall structure being formed by:
    using a chemically amplified resist as a material of the wall structure,
    a step of applying the chemically amplified resist; and
    a step of exposing and developing the chemically amplified resist.

2. The method for manufacturing a liquid crystal display device according to claim 1, wherein a positive resist is used as the chemically amplified resist.

3. The method for manufacturing a liquid crystal display device according to claim 1, further comprising, after the exposing and developing of the chemically amplified resist, the steps of:
    post-exposing a remaining chemically amplified resist by irradiating light on entire remaining chemically amplified resist;
    pre-calcinating the chemically amplified resist at a temperature lower than a main calcination temperature; and
    performing a main calcination at a temperature higher than a pre-calcination temperature.

4. The method for manufacturing a liquid crystal display device according to claim 3, wherein the pre-calcination temperature is 150° C. or lower and the main calcination temperature is 200° C. or higher.

5. The method for manufacturing a liquid crystal display device according to claim 4, wherein the pre-calcination temperature is 80 to 120° C., which is equal to or lower than a glass transition temperature of a resist material, and the main calcination temperature is 200 to 250° C. at which a hardening reaction proceeds.

6. The method for manufacturing a liquid crystal display device according to claim 1, wherein a tapered angle of the formed wall structure is equal to or larger than 70 degrees and smaller than 90 degrees.

7. The method for manufacturing a liquid crystal display device according to claim 1, wherein an insulating and planarizing film is further formed by:
    using a positive resist as a material of the insulating and planarizing film provided between the wall structures,
    a step of applying the positive resist;
    a step of exposing and developing the positive resist; and
    a step of performing main calcination on the positive resist.

8. The method for manufacturing a liquid crystal display device according to claim 7, wherein a chemically amplified positive resist is used as the positive resist.

9. The method for manufacturing a liquid crystal display device according to claim 8, wherein as the performing of the main calcination, the main calcination is performed at 200° C. or higher.

10. The method for manufacturing a liquid crystal display device according to claim 8, wherein the main calcination is performed at a rate of temperature increase of 5° C. or higher.

11. The method for manufacturing a liquid crystal display device according to claim 8, wherein the main calcination is performed at a rate of temperature increase of 10° C. or higher.

12. The method for manufacturing a liquid crystal display device according to claim 8, wherein the same material is used for both a resist material of the wall structure and a resist material of the insulating and planarizing film.

13. The method for manufacturing a liquid crystal display device according to claim 7, wherein when the resist is exposed, the resist is exposed by a mask having an opening which is equal to or larger than a horizontal width of an apex of the wall.

* * * * *